United States Patent [19]

Onesti

[11] Patent Number: 4,739,184
[45] Date of Patent: Apr. 19, 1988

[54] PORTABLE TRANSDUCER SIMULATOR

[75] Inventor: Robert J. Onesti, Fort Wayne, Ind.

[73] Assignee: Navistar International Transportation Corp., Chicago, Ill.

[21] Appl. No.: 44,935

[22] Filed: May 1, 1987

[51] Int. Cl.⁴ .......................................... G01M 19/00
[52] U.S. Cl. ..................................... 307/10 R; 307/9;
 307/115; 324/73 R; 324/158 MG; 338/77;
 73/865.9; 73/865.5
[58] Field of Search ........................ 307/10 R, 9, 115;
 340/52 R, 52 D, 52 F; 324/62, 63, 64, 74, 73 R,
 73 AT; 73/865.9, 865.5, 866.4; 338/50, 77, 200,
 201, 226, 227, 228, 229, 235, 260

[56] References Cited

U.S. PATENT DOCUMENTS

| | | | |
|---|---|---|---|
| 2,954,518 | 9/1960 | Dugot | 338/77 X |
| 3,300,713 | 1/1967 | Fulton | 324/73 X |
| 3,406,335 | 10/1968 | Magee et al. | 324/62 R |
| 3,435,251 | 3/1969 | Ellner | 307/115 |
| 3,452,276 | 6/1969 | Behrendt | 324/73 R |
| 3,890,836 | 6/1975 | McKenzie et al. | 324/73 R X |
| 4,081,022 | 3/1978 | Wester | 324/73 R X |
| 4,146,085 | 3/1979 | Wills | 324/73 R X |
| 4,445,047 | 4/1984 | Cannon | 324/158 MG X |
| 4,517,839 | 5/1985 | Van Dyke | 324/73 R X |

Primary Examiner—William M. Shoop, Jr.
Assistant Examiner—Paul Ip
Attorney, Agent, or Firm—F. David AuBuchon; Dennis K. Sullivan

[57] ABSTRACT

A hand-held portable transducer simulator unit connects to a vehicle's instrumentation circuitry in substitution of the vehicle's own pressure and/or temperature transducers for diagnostic checking of the instrumentation circuitry. Various sets of adapter cables are available for use to connect the unit to the instrumentation circuitry depending upon the particular model and accessories involved. The unit simulates both pressure and temperature transducers and contains various resistor loads which are selectively presented to the instrumentation circuitry through use of a rotary selector switch on the face of the unit to simulate transducer response to various conditions. The information presented on the vehicle's instrumentation display is monitored for correspondence to the simulated conditions selected by the selector switch.

14 Claims, 2 Drawing Sheets

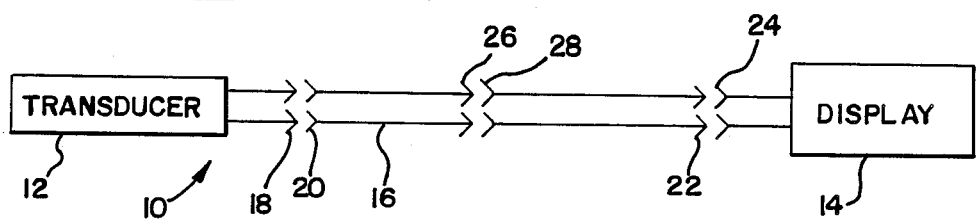
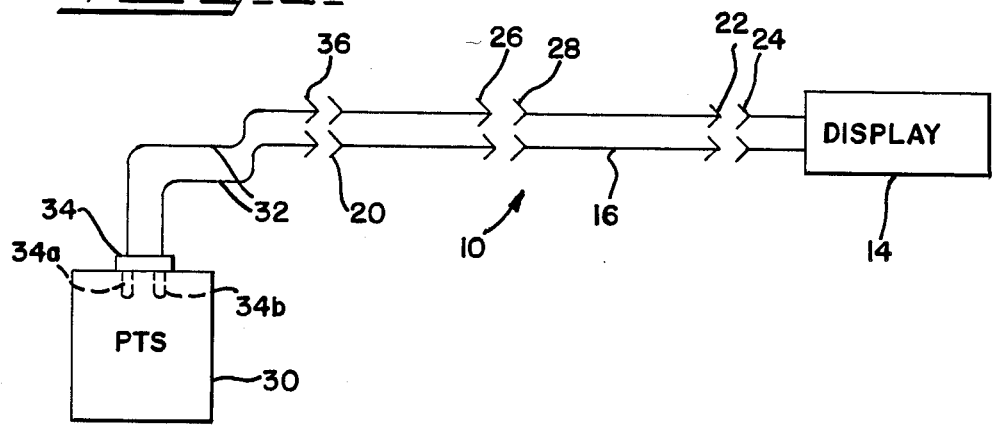
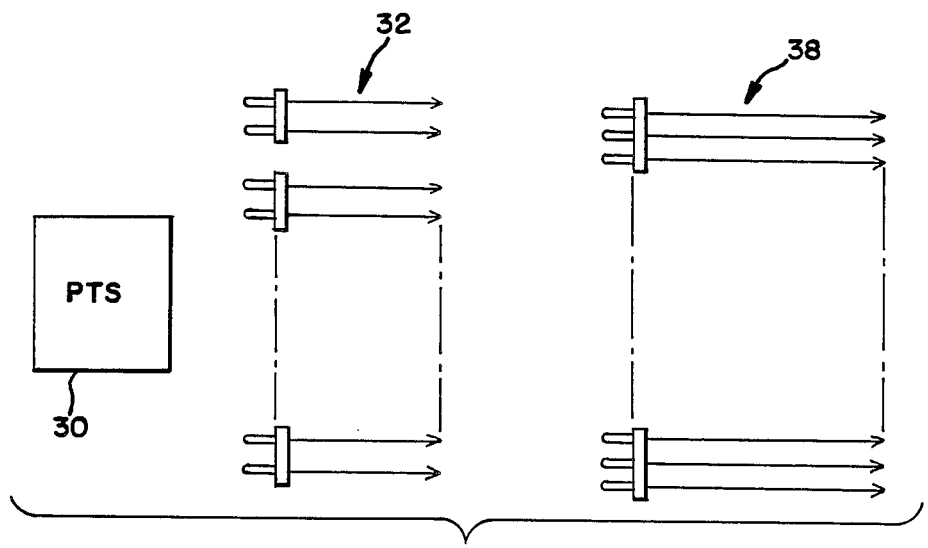

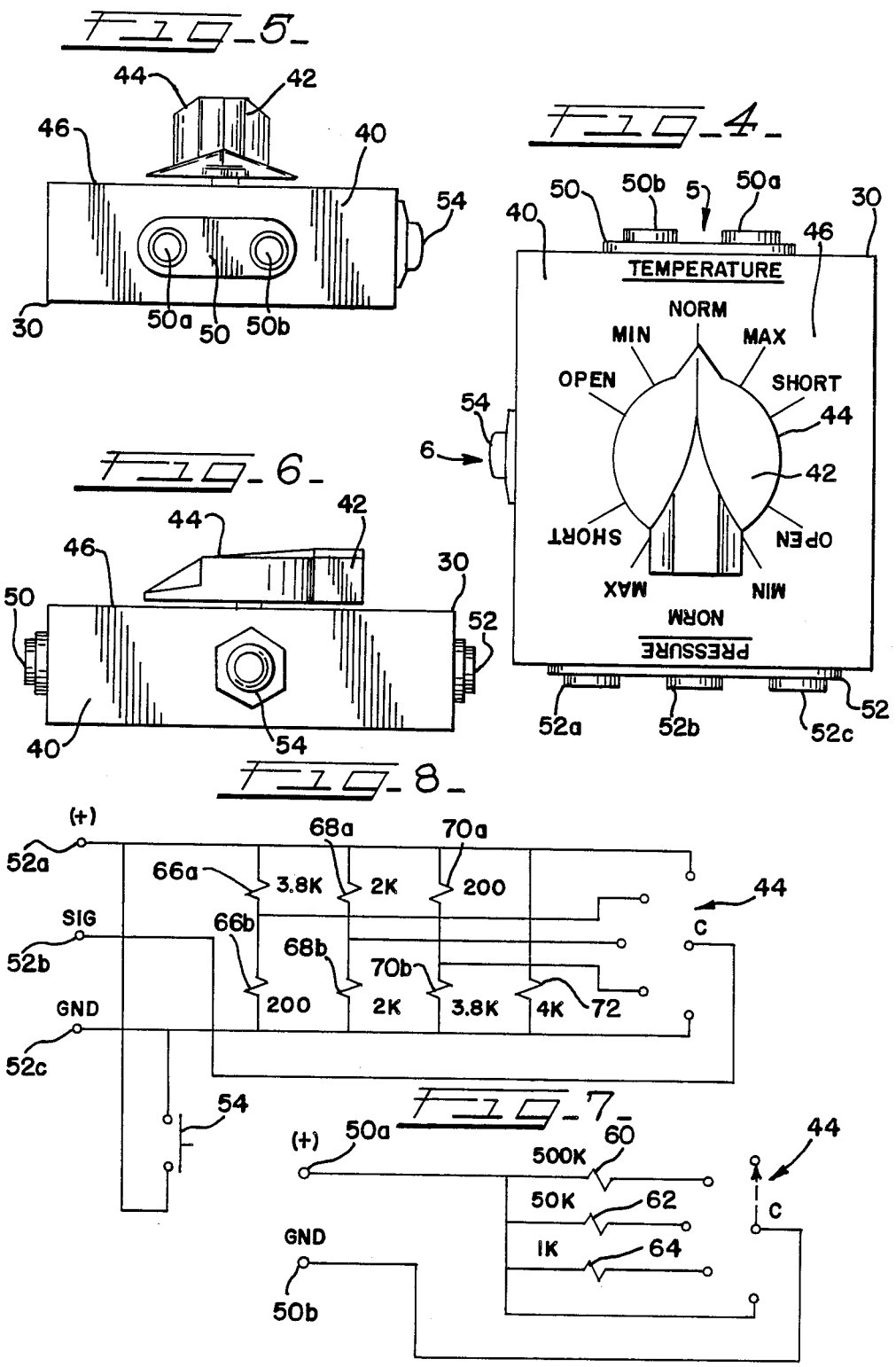

PORTABLE TRANSDUCER SIMULATOR

BACKGROUND AND SUMMARY OF THE INVENTION

This invention relates to a portable transducer simulator for use in the development and/or maintenance of instrumentation circuitry in automotive vehicles.

Automotive vehicles contain instrumentation circuits which present information to the vehicle operator concerning operating conditions of the vehicle. In large trucks such as highway tractors there are a substantial number of instrumentation circuits which present information about the operating conditions of various parts of the powertrain, such as, for example, engine oil pressure, engine oil temperature, coolant temperature, transmission fluid temperature, etc.

Each circuit is operated by a transducer, or sensor, which is physically disposed on the vehicle at an appropriate location to monitor the condition of interest. Each transducer develops an electrical signal indicative of the condition of interest. These signals are conducted through various wiring harnesses of the vehicle to appropriate instrumentation, such as, for example, electronic read-outs or electrical gages, on the vehicle's instrument panel. In this way the values of the monitored conditions are presented to the vehicle operator.

The ability to simulate the various transducers may be advantageous in the diagnostic checking of a vehicle's instrumentation circuitry. For example, the ability to check a temperature instrumentation circuit without having to warm up and cool down a vehicle can yield considerable savings in time and labor.

The availability of many different vehicle models and optional accessories has complicated diagnostic testing from the standpoint of compatability of test equipment with vehicles. The availability of many different models and accessories has spawned numerous different physical configurations for the electric circuit terminations of wiring harnesses and electrical devices, even though the same circuits in different vehicles may be essentially electrically identical. Moreover, the increased use of electronic instrumentation in a vehicle has increased the need for diagnostic testing, and equipment which will serve this end is becoming increasingly important, particularly where it is not overly complex and can be expeditiously used for diagnosis.

The present invention relates to a portable transducer simulator which is well-suited for compatability with different vehicle models and accessories in simulating one or more actual transducers for the expeditious checking of a vehicle's instrumentation circuitry. These attributes are embodied in apparatus which comprises a small portable transducer simulator unit and a number of adapter cables each of which serves to adapt the unit for connection into a particular vehicle wiring harness in substitution of one or more of the vehicle's transducers which operate the vehicle's instrumentation circuitry.

The unit comprises a compact case which contains resistance values representative of typical transducer resistance values for various transducer operating conditions. It also has a rotary selector switch which the user operates to select particular resistance values for presentment to the instrumentation circuitry when the simulator unit is connected to the vehicle instrumentation circuitry via the appropriate adapter cable in substitution of the actual transducer being simulated. Presentment of known resistance values to the instrumentation circuitry enables the response of the circuitry to known inputs to be ascertained. The disclosed embodiment possesses the ability to simulate both temperature and pressure transducers so that pressure and temperature circuits can be quickly and reliably checked. Moreover, the specific arrangement of the temperature and pressure simulating capabilities in the unit is especially conducive to facile and expeditious usage.

The foregoing features, advantages, and benefits of the invention, along with additional ones, will be seen in the ensuing description and claims which should be considered in conjunction with the accompanying drawings. The drawings, in which like reference numerals designate like parts, portray a presently preferred embodiment of the best mode contemplated in carrying out the invention.

BRIEF DESCRIPTION OF THE DRAWINGS

FIG. 1 is a simplified schematic representation of an automotive vehicle instrumentation circuit with which the present invention is useful.

FIG. 2 is a view similar to FIG. 1 illustrating use of the present invention.

FIG. 3 is a simplified schematic representation of apparatus embodying the present invention.

FIG. 4 is a plan view of one part of the apparatus portrayed in FIG. 3.

FIG. 5 is a view in the direction of arrow 5 in FIG. 4.

FIG. 6 is a view in the direction of arrow 6 in FIG. 4.

FIG. 7 is a schematic diagram of a portion of the apparatus portrayed in FIG. 4.

FIG. 8 is a schematic diagram of another portion of the apparatus portrayed in FIG. 4.

DESCRIPTION OF THE PREFERRED EMBODIMENT

FIG. 1 shows a representative automotive vehicle instrumentation circuit 10 containing a transducer 12 and a display 14 connected together by wiring 16. Typically the wiring is part of one or more harnesses and includes connectors for connecting the various harnesses and devices in circuit. While FIG. 1 portrays separably mated connectors 18, 20 at the transducer, separably mated connectors 22, 24 at the display, and separably mated connectors 26, 28 in the wiring, it is to be appreciated that these are merely representative. The transducer is disposed to sense a particular condition associated with the operation of the vehicle powertrain, such as those enumerated earlier, and to provide a corresponding signal to the display whereby the display discloses an indication of the condition. In the case of a temperature circuit, the display would present the sensed temperature.

FIG. 2 illustrates portable transducer simulator apparatus embodying principles of the invention in use in circuit 10 simulating transducer 12. The portable transducer simulator (PTS) apparatus shown in this Fig. comprises a transducer simulator unit 30 and an adapter cable 32. Unit 30 is connected with display 14 in substitution of transducer 12. The substitution is performed by disconnecting connectors 18, 20 at transducer 12 and then connecting unit 30 to connector 20 by means of adapter cable 32.

Adapter cable 32 comprises suitable terminations 34, 36 at opposite ends. Termination 34 comprises two plugs 34a, 34b for separable mating connection with unit 30; termination 36 is a connector having a physical configuration for separable mating connection with the particular connector 20 of the vehicle wiring harness. The circuit configuration in FIG. 2 directly substitutes unit 30 for transducer 12 such that operation of display 14 is controlled by unit 30.

Before a detailed description of unit 30 is begun, it is appropriate to point out that the unit is endowed with the ability to simulate multiple transducers and that the simulator apparatus is compatable with various wiring harness configurations. Such versatility is achieved through the provision of multiple adapter cables some of which are electrically identical to the two conductor adapter cable 32, but have different physical configurations for the termination which connects into the vehicle wiring harness, and others of which are three conductor cables having one termination for connection into the vehicle wiring harness and the other termination for connection to unit 30. FIG. 3 portrays a set of the apparatus comprising unit 30, multiple two conductor adapter cables, 32 generally, and multiple three conductor adapter cables, 38 generally. Each adapter cable 32 has the same termination 34 for connection to unit 30, but a unique termination 36 for adaptation to a particular wiring harness connector; likewise, each three conductor adapter cable 38 has the same termination for connection to unit 30, but a unique termination at the opposite end for adaptation to a particular wiring harness connector. It is to be appreciated that the particular physical configuration for any adapter cable is a function of the specific vehicle's wiring harness design. Hence so long as the same types of transducers continue to be used in new vehicle models, at most a new adapter cable will have to be fabricated to maintain the usefulness of the PTS apparatus.

FIGS. 4, 5, and 6 illustrate details of unit 30. The illustrated embodiment comprises a rectangular case 40 fabricated as a small aluminum box. The knob 42 of a rotary selector switch 44 is on the exterior face 46 of case 40. The switch body is disposed within the interior of case 40, and the shaft to which knob 42 is affixed passes through a hole in the center of face 46.

The illustrated switch is a twelve position one, and for convenience in description, reference will be made to positions of the clock. For example, FIG. 4 shows knob 42 pointing to the twelve o'clock position, and this will be described as the twelve o'clock position of the switch.

Unit 30 has the ability to simulate both temperature and pressure transducers. The temperature simulation comprises a span extending from the ten o'clock to the two o'clock position, as seen in FIG. 4; the pressure simulation comprises a span extending from the four o'clock to the eight o'clock position. The five positions for temperature simulation are as marked on face 46 at the ten, eleven, twelve, one, and two o'clock positions; the five settings for pressure simulation are marked at the four, five, six, seven, and eight o'clock positions. The three and nine o'clock positions are not used.

Temperature transducer simulation involves selective substitution of a single resistance value, and hence a two conductor jack 50 having receptacles 50a, 50b is associated with the temperature simulation settings. Pressure transducer simulation involves selective substitution of complementary fractions of resistance value, and hence, a three conductor jack 52 having receptacles 52a, 52b, 52c is associated with the pressure simulation settings. The jacks 50, 52 are preferably the type commonly referred to as banana jacks. Correspondingly, the terminations on the respective adapter cables which separably connect to the banana jacks are respective banana plugs.

For convenient usage of the apparatus, both jacks 50, 52 are disposed in the side of case 40 such that as viewed in the direction of FIG. 4, jack 50 lies within the ten-two o'clock range spanned by the temperature simulation settings and jack 52 lies within the four-eight o'clock pressure simulation range of settings. Moreover the indicia on face 46 is presented in the actual manner shown with the pressure simulating indicia upside down from the temperature simulating indicia. Temperature transducer simulation may be performed with the case disposed in the person's hand in the orientation of FIG. 4 enabling the person to conveniently read the temperature range settings and operate the selector switch over that range while an adapter cable used for temperature simulation extends away from what would be considered the top of the case above the temperature simulation range. For pressure transducer simulation, the case is held in the person's hand upside down from the orientation of FIG. 4 so that the pressure range settings are presented upright for reading while an adapter cable used for pressure simulation leads from what is now the top of the case just above the pressure simulation range. A normally open push-button switch 54 is mounted in the side of the case in a portion which adjoins the portions containing the respective jacks 50, 52. As will be seen later, switch 54 is used in association with the pressure simulation function.

FIG. 7 illustrates the internal construction for the temperature simulation function of the PTS while FIG. 8 shows that of the pressure simulation function. Switch 44 has a common terminal C and twelve taps corresponding to the twelve switch settings. The common C connects to one of the two receptacles of jack 50 and also to one of the three receptacles of jack 52.

The temperature simulation function comprises a series of loads corresponding to the five settings marked on the case. These loads simulate a negative temperature coefficient transducer corresponding to minimum, normal, and maximum temperatures at the eleven, twelve, and one o'clock positions. The ten o'clock position represents an open circuit and the two o'clock position, a closed circuit. There are three resistors 60, 62, 64 of different resistance value as indicated for the minimum, normal, and maximum settings, and switch 44 serves to selectively switch them into circuit between the two receptacles of jack 50. In the ten o'clock setting there is an open circuit between the two receptacles of jack 50 while in the two o'clock setting there is a short circuit between the two receptacles of jack 50.

The pressure simulation function simulates a transducer which is energized by a known voltage from a power supply and outputs a percentage of that voltage as a function of sensed pressure. The pressure simulation function comprises a series of settings corresponding to those marked on the face of the case. There are four sets of identical resistor values (4K each) in parallel between receptacles 52a, 52c of jack 52. Three of the four comprise series resistors 66a, 66b; 68a, 68b; 70a, 70b; of the individual values indicated. The fourth is a single resistor 72 of the 4K value indicated. The junctions of the series resistor pairs are respectively connected to the five, six, and seven o'clock positions respectively of the selector switch. The four o'clock position is connected to receptacle 52a, and the eight o'- clock position to receptacle 52c. Switch 54 is connected between receptacles 52a, 52c.

Each setting of the selector switch presents a unique fractional proportion of one 4K resistance between receptacles 52a, 52b, and the remainder between receptacles 52b, 52c, while the equivalent 1K load which is present at all times across receptacles 52a, 52c corresponds to the load which the transducer being simulated presents to the transducer power supply in the vehicle. The unit thereby simulates a high accuracy, ratiometric pressure transducer by simulating open condition, low value, normal value, high value, and shorted connection. When push-button switch 54 is closed, it shorts the transducer power supply to ground, thereby facilitating testing of the power supply's short circuit protection.

In use, the appropriate hook-up will be made and the selector switch operated to the appropriate positions. The instrumentation display in the vehicle can be observed for proper response to each simulating condition. Testing can be performed expeditiously and with the ability to distinguish an instrumentation circuit operating within specifications from one which is not. Hence, the invention aids in the performance of diagnostic testing which is typically encountered in the development and maintenance of automotive vehicle instrumentation circuitry.

While a preferred embodiment of the invention has been disclosed, it will be appreciated that principles of the invention are applicable to other embodiments.

What is claimed is:

1. A portable transducer simulator for use in development and/or maintenance of automotive vehicle electrical instrumentation circuitry which receives information concerning at least one of pressure and temperature from at least one automotive vehicle mounted transducer associated with the automotive vehicle powertrain, said simulator comprising a case, electrical resistance load means within said case for simulating certain characteristic loads exhibited by the actual at least one automotive vehicle mounted transducer, selection means mounted on said case and operable to select a particular electrical resistance load of said electrical resistance load means, and terminal means at which a particular electrical resistance load selected by said selection means is presented, said terminal means being disposed on said case for connection to automotive vehicle instrumentation circuitry in substitution of the actual at least one transducer which operates the circuitry such that the electrical load presented at said terminal means simulates the load presented by the actual at least one transducer for a particular condition of said at least one of pressure and temperature sensed by the actual at least one transducer being simulated, said electrical resistance load means comprising a first series of loads for simulating loads presented by a pressure transducer at different pressure conditions and a second series of loads for simulating loads presented by a temperature transducer at different temperature conditions, said terminal means comprising one set of terminals associated with said first series of loads and another set of terminals associated with said second series of loads, and in which said one set of terminals comprises three terminals and said another set of terminals comprises two terminals, said first series of loads comprising separate but substantially identical resistance values each of which is divided into a unique fraction and corresponding remainder which together constitute the whole of the resistance value, said second series of loads comprising unique resistance values, said selection means comprising means for selectively connecting the unique fractions of the resistance values of said first series of loads for presentment across first and second terminals of said one set of terminals and the remainder for presentment across the second and a third terminal of said one set of terminals such that the total resistance across said first and third terminals corresponds substantially to the actual pressure transducer load and the resistances between the second terminal and the first and third terminals of said one set of terminals correspond to a particular pressure simulation and for selectively connecting each of said resistance values of said second series of loads for presentment across the two terminals of said another set of terminals.

2. A portable transducer simulator as set forth in claim 1 in which said case comprises a face bounded by a side, said selection means comprises a rotary selector switch disposed on said face with its axis of rotation perpendicular to said face, said one and said another sets of terminals being disposed on said side, said rotary selector switch being operable over one angular range of discrete selection positions on said face for selectively connecting said unique fractions of the resistance values of said first series of loads across the first and second terminals of said one set of terminals and the corresponding remainders across the second and third terminals of said one set, and said rotary selector switch being also operable over another angular range of discrete selection positions on said face for selectively connecting said resistance values of said second series of loads across the two terminals of said another set of terminals, the location of said one set of terminals in said case's side lying within the span of said one angular range, as viewed in the direction of the case's face, and the location of said another set of terminals in said case's side lying within the span of said another angular range, as viewed in the direction of the case's face.

3. A portable transducer simulator as set forth in claim 2 in which said case has a generally rectangular shape, said one set of terminals is in a portion of the side of said case directly opposite another portion of the side of said case which contains said another set of terminals, and including a normally open push-button switch in a further portion of the side of said case which adjoins said one and said another portions of the side, said push-button switch being connected between said first and third terminals of said one set of terminals for selective closure to short said first and third terminals of said one set of terminals together.

4. A portable transducer simulator as set forth in claim 2 in which each of said ranges comprises a normal setting for selecting resistance which simulates a normal condition, at least one above-normal setting for selecting resistance which simulates an above-normal condition, and at least one below-normal setting for selecting resistance which simulates a below-normal condition.

5. A portable transducer simulator as set forth in claim 4 in which each of said ranges further includes open and short circuit settings at opposite extremes of each range for respectively simulating open and short circuits.

6. A portable transducer simulator for use in development and/or maintenance of automotive vehicle electrical instrumentation circuitry which receives information concerning pressure from an automotive vehicle mounted pressure transducer associated with the automotive vehicle powertrain, said simulator comprising a case, electrical resistance load means within said case for simulating certain characteristics loads exhibited by the actual automotive vehicle mounted pressure transducer, selection means mounted on said case and operable to select a particular electrical resistance load of said electrical resistance load means, and terminal means at which a particular electrical resistance load selected by said selection means is presented, said terminal means being disposed on said case for connection to automotive vehicle instrumentation circuitry in substitution of the actual pressure transducer which operates the circuitry such that the electrical load presented at said terminal means simulates the load presented by the actual pressure transducer, said electrical resistance load means comprising plural, substantially identical, resistance values connected in parallel circuit relationship, said terminal means comprising three terminals, said selection means comprising means for selectively connecting unique fractions of each resistance value for presentment across first and second of said terminals and the remainder across the second and third of said terminals while the parallel combination of said resistance values is presented across said first and third terminals and and has a value corresponding to the load imposed by the actual pressure transducer.

7. A portable transducer simulator as set forth in claim 6 further including on said case a normally open switch connected between said first and third terminals for selective closure to short said first and third terminals together.

8. A portable transducer simulator for use in development and/or maintenance of automotive vehicle electrical instrumentation circuitry which receives information concerning at least one of pressure and temperature from at least one automotive vehicle mounted transducer associated with the automotive vehicle powertrain, said simulator comprising a case, electrical resistance load means within said case for simulating certain characteristic loads exhibited by the actual at least one automotive vehicle mounted transducer, selection means mounted on said case and operable to select a particular electrical resistance load of said electrical resistance load means, and terminal means at which a particular electrical resistance load selected by said selection means is presented, said terminal means being disposed on said case for connection to automotive vehicle instrumentation circuitry in substitution of the actual at least one transducer which operates the circuitry such that the electrical load presented at said terminal means simulates the load presented by the actual at least one transducer for a particular condition of said at least one of pressure and temperature sensed by the actual at least one transducer being simulated, said electrical resistance load means comprising a first series of loads for simulating loads presented by a pressure transducer at different pressure conditions and a second series of loads for simulating loads presented by a temperature transducer at different temperature conditions, and said first series of loads comprising separate but substantially identical resistance values each of which is divided into a unique fraction and corresponding remainder which together constitute the whole of the resistance value, said second series of loads comprising unique resistance values, said selection means comprising means for selectively connecting to said terminal means each resistance value of said second series of loads and the unique fraction and corresponding remainder of each resistance value of said first series of loads such that the resistance values from said two series of loads are presented independently and one at a time at said terminal means and the resistance load presented at said terminal means is substantially the same as the load imposed by the actual transducer being simulated at the particular condition.

9. A portable transducer simulator as set forth in claim 8 in which said case comprises a face bounded by a side, said selection means comprises a rotary selector switch disposed on said face with its axis of rotation perpendicular to said face, said terminal means comprising one and another sets of terminals disposed on said case, said rotary selector switch being operable over one angular range of discrete selection positions on said face for selectively connecting said first series of loads one at a time to said one set of terminals and over another angular range of discrete selection positions on said face for selectively connecting said second series of loads one at a time to said another set of terminals.

10. A portable transducer simulator as set forth in claim 9 in which the location of said one set of terminals is in said case's side and lies within the span of said one angular range, as viewed in the direction of the case's face, and the location of said another set of terminals is in said case's side and lies within the span of said another angular range, as viewed in the direction of the case's face.

11. A portable transducer simulator as set forth in claim 10 in which said case has a generally rectangular shape, said one set of terminals is in a portion of the side of said case directly opposite another portion of the side of said case which contains said another set of terminals, and including a normally open push-button switch in a further portion of the side of said case which adjoins said one and said another portions of the side, said push-button switch being connected between two particular terminals of said one set of terminals for selective closure to short said two particular terminals of said one set of terminals together.

12. A portable transducer simulator as set forth in claim 11 in which each of said ranges comprises a normal setting for selecting resistance which simulates a normal condition, at least one above-normal setting for selecting resistance which simulates an above-normal condition, and at least one below-normal setting for selecting resistance which simulates a below-normal condition.

13. A portable transducer simulator as set forth in claim 12 in which each of said ranges further includes open and short circuit settings at opposite extremes of each range for respectively simulating open and short circuits.

14. A portable transducer simulator for use in development and/or maintenance of automotive vehicle electrical instrumentation circuitry which receives information concerning plural conditions from respective automotive vehicle mounted transducers associated with the automotive vehicle electrical instrumentation circuitry, said simulator comprising a case, electrical load means within said case for simulating certain characteristic loads exhibited by the actual transducers, selection means mounted on said case and operable to select a particular electrical load of said electrical load means, and terminal means at which a particular electrical load selected by said selection means is presented, said terminal means being disposed on said case for connection to automotive vehicle electrical instrumentation circuitry in substitution of the actual transducers which operate the circuitry such that the particular electrical load presented at said terminal means simulates the load presented by the actual transducer for a particular value of the condition sensed by the actual transducer being simulated, said electrical load means comprises a first series of loads for simulating loads presented by one transducer for different values of a condition sensed by the transducer and a second series of loads for simulating loads presented by another transducer for different values of a condition sensed by the latter transducer, said terminal means comprises one set of terminals associated with said first series of loads and another set of terminals associated with said second series of loads, said case comprises a face bounded by a side, said selection means comprises a rotary selector switch disposed on said face with its axis of rotation perpendicular to said face, said one and said another sets of terminals being disposed on said side, said rotary selector switch being operable over one angular range of discrete selection positions on said face for selectively connecting said loads of said first series of loads to said one set of terminals and over another angular range of discrete selection positions on said face for selectively connecting said loads of said second series of loads to said another set of terminals, the location of said one set of terminals in said case's side lying within the span of said one angular range, as viewed in the direction of the case's face, and the location of said another set of terminals in said case's side lying within the span of said another angular range, as viewed in the direction of the case's face.

* * * * *